United States Patent [19]

Jones

[11] Patent Number: 5,312,585

[45] Date of Patent: May 17, 1994

[54] CORROSION INHIBITION IN HIGH TEMPERATURE ENVIRONMENT

[75] Inventor: Robert L. Jones, Fairfax, Va.

[73] Assignee: The United States of America as represented by the Secretary of the Navy, Washington, D.C.

[21] Appl. No.: 82,640

[22] Filed: Jun. 28, 1993

[51] Int. Cl.$^5$ .................................................. C23F 11/04
[52] U.S. Cl. ........................................ 422/7; 106/1.25; 106/14.05; 106/286.1; 106/287.18
[58] Field of Search ................ 422/7, 8, 19; 106/1.25, 106/14.05, 286.1, 287.18

[56] References Cited

U.S. PATENT DOCUMENTS

| | | | |
|---|---|---|---|
| 4,175,163 | 11/1979 | Ikeno et al. | 106/14.05 |
| 4,196,004 | 4/1980 | Berretz | 106/14.05 |
| 4,908,065 | 3/1990 | Tanitsu et al. | 106/287.18 |

*Primary Examiner*—Timothy M. McMahon
*Attorney, Agent, or Firm*—Thomas E. McDonnell; George A. Kap

[57] ABSTRACT

This invention pertains to the use of tin oxide as a corrosion resistant material for preventing or inhibiting high temperature corrosion by molten sulfate-vanadate deposits and gaseous sulfur trioxide formed in engines or other high temperature apparatus which burn materials containing sodium, sulfur, and vanadium.

16 Claims, No Drawings

CORROSION INHIBITION IN HIGH TEMPERATURE ENVIRONMENT

FIELD OF INVENTION

This invention pertains to high temperature corrosion, and more particularly, to the inhibition of high temperature corrosion with tin oxide.

BACKGROUND OF INVENTION

Many low cost, low grade petroleum and coal fuels contain appreciable levels of sodium, sulfur, and vanadium. Low quality marine residual fuels, for example, may contain up to 0.2 weight percent ash which contains appreciable amounts of sodium, up to 5 weight percent sulfur and up to 0.06 weight percent or 600 ppm vanadium. Low grades of marine distillate fuels are allowed up to 0.05 weight percent ash which contains appreciable amounts of sodium, up to 2 weight percent sulfur and up to 100 ppm vanadium. In addition, salts containing sodium, sulfur, and vanadium may also be ingested in the air intake of an engine or furnace operating in dusty or sea mist laden environments. Waste materials being burned in incinerators may, likewise, contain sodium, sulfur and vanadium.

In high temperature, oxygen-rich combustion environments, sodium, sulfur and vanadium are oxidized predominantly to the oxides of sodium, sulfur and vanadium, particularly sodium oxide, sulfur trioxide and vanadium pentoxide. These oxide species interact and condense as corrosive, molten deposits on such components as gas turbine blades, diesel engine exhaust valves and pistons, boiler tubes, and incinerator walls, or if gaseous, are found in the gas phase above. The corrosion caused by such deposits can be virulent and highly damaging, with the service life of the component being reduced by 80% or more, in some instances.

Molten deposits of this type are commonly described as "sodium sulfate-sodium vanadate" or "sulfate-vanadate" deposits. They contain sodium oxide, sulfur trioxide, sodium sulfate, sodium vanadate, and possibly other components, with sulfur trioxide gas in the gaseous phase above the deposits. Concentrations of the individual components in the molten and gaseous phases are fixed by such simultaneous chemical reactions as:

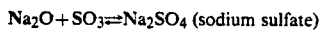

$Na_2O + SO_3 \rightleftharpoons Na_2SO_4$ (sodium sulfate)  [1]

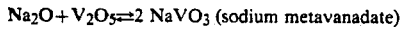

$Na_2O + V_2O_5 \rightleftharpoons 2 NaVO_3$ (sodium metavanadate)  [2]

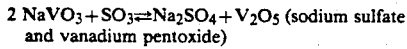

$2 NaVO_3 + SO_3 \rightleftharpoons Na_2SO_4 + V_2O_5$ (sodium sulfate and vanadium pentoxide)  [3]

The concentrations of the different components in the molten deposits and the gaseous phase thereabove depend also on the Na/V/S ratios in the fuel and intake air, as well as the temperature. Note that by reaction [3], an increase in the fuel sulfur content, for a fixed Na/V ratio, increases not only the $Na_2SO_4$ concentration but also the $V_2O_5$ concentration in the molten deposit.

Molten salt corrosion, or "hot corrosion", results when the oxides of sodium, sulfur and vanadium, such as $Na_2O$, $SO_3$, and $V_2O_5$ react with the protective surface oxide layer that exists on high temperature substrates, particularly metal alloys or ceramics. Under various circumstances, reaction with either sodium oxide, sulfur trioxide or vanadium pentoxide may be the predominant cause of hot corrosion. For example, in the well known "basic fluxing" mode of hot corrosion at 900° C., $Na_2O$ from $Na_2SO_4$-rich deposits reacts with the alumina surface film on gas turbine superalloys to form nonprotective $NaAlO_2$ which causes catastrophic hot corrosion. High temperature chromium-containing metals which rely on chromia protective surface oxide are also corroded by $Na_2SO_4$-rich deposits via formation of nonprotective $Na_2CrO_4$. Conversely, in 700° C. "low temperature" hot corrosion, sulfur trioxide gas, which is present in the corrosive environment, reacts with cobalt oxide from CoCrAlY turbine blade coatings to form low-melting mixed $CoSO_4$-$Na_2SO_4$ eutectic deposits and yields an "acidic fluxing" type of hot corrosion. Fuels containing vanadium often cause a "vanadate" type of hot corrosion wherein vanadium pentoxide from the molten deposit reacts with nickel oxide or cobalt oxide from nickel-based or cobalt-based superalloys, or with ferric oxide from high temperature steels, to produce spalling metal vanadates.

Similar hot corrosion reactions involving sodium oxide, sulfur trioxide, and vanadium pentoxide occur with ceramics. For instance, sodium oxide from $Na_2SO_4$-rich molten deposits reacts with the surface film of silica that normally protects silicon carbide and silicon nitride ceramics in oxygen-rich engine environments. This type of hot corrosion represents a serious threat to the use of silicon carbide and silicon nitride components in land and marine engines. High sulfur fuels, containing in excess of 1 weight percent sulfur, attack yttria-stabilized zirconia thermal barrier coatings through reaction of the engine gas sulfur trioxide with yttria to form low-melting eutectic sulfate mixtures. The reaction of yttria in yttria-stabilized zirconia with the vanadium pentoxide component of sulfate-vanadate engine deposits is another ceramic hot corrosion problem which, at present, precludes use of yttria-stabilized zirconia thermal barrier coatings in marine and land engines burning fuels which contain vanadium.

Therefore, no material is known which inhibits hot corrosion in the presence of vanadate-sulfate molten deposits containing high concentrations of oxides of sodium and vanadium in the melt and gaseous oxides of sulfur in the gaseous phase thereabove.

SUMMARY OF INVENTION

An object of this invention is the inhibition of corrosion in a hot atmosphere containing corrosive components by the use of an inexpensive material which is nonreactive with the corrosive components.

Another object of this invention is the inhibition of hot corrosion by the use of a tin oxide.

These and other objects of this invention are accomplished by combusting a fuel containing sodium, vanadium and sulfur to form reaction products containing oxides of sodium, vanadium and sulfur, and contacting a structural member with the reaction products, the structural member comprising tin oxide.

DETAILED DESCRIPTION OF THE INVENTION

The invention described and claimed herein pertains to a method which comprises the step of contacting a structural member with oxides of sodium and sulfur at a temperature exceeding 300° C., the structural member comprising tin oxide.

More specifically, this invention pertains to a method for combusting a hydrocarbon fuel in an engine, a furnace, an incinerator or another high temperature apparatus. The hydrocarbon fuel contains sodium, sulfur and vanadium and forms, on combustion, reaction products containing oxides of sodium, sulfur and vanadium. In order to inhibit corrosion in a hot atmosphere, the method also includes the step of contacting the reaction products with a structural member comprising tin dioxide at a temperature of 300°–1500° C., preferably 500°–1000° C.

Although combustion temperature of a hydrocarbon fuel is well above 2000° C., it is believed that contact between the gaseous reaction products and the structural members takes place at a temperature in the approximate range of 300°–1500° C., preferably 500°–1000° C. At these temperatures, in an atmosphere containing sufficient oxygen, it is believed that sodium, sulfur and vanadium exist as oxides, including sodium oxide, sulfur trioxide and vanadium pentoxide.

To be useful as an inhibitor in a hot corrosion environment as herein described, tin oxide, particularly tin dioxide, must meet certain physical as well as chemical requirements. The oxide must have the structural strength, thermal shock tolerance, erosion resistance, etc., to make it capable of being used as a coating or cladding, or of being fabricated into objects or components for use in engines or other high temperature applications. It must have sufficiently low volatility to be able to survive for long periods at high temperature, and finally, the oxide must be stable, i.e., not reducible, at the oxygen partial pressures existing in the given high temperature environment.

Tin dioxide has a melting point of 1630° C. It has good thermal shock resistance and is potentially useable at temperatures of up to 1500° C. in oxidizing environments. Tin dioxide has a Knoop hardness of about 1000 to 1600 kg mm$^{-2}$, varying because of anisotropy, and thus should have an erosion resistance falling between that of $ZrO_2$, which has a hardness of 1160 kg mm$^{-2}$, and $Al_2O_3$, which has a hardness of 2000 kg mm$^{-2}$, since the erosion resistance of oxides is principally a function of hardness. The vapor pressure of tin dioxide is higher than that of most refractory ceramic oxides, having maximum evaporation rates of about $1 \times 10^{-15}$ g/cm$^2$-sec at 1100 K (827° C.) and $1 \times 10^{-9}$ g/cm$^2$-sec at 1300 K (1027° C.), under 0.2 bar of oxygen. However, the loss of tin oxide by evaporation from components in engines or furnaces at operating temperatures should be negligible. For instance, even at 1300 K (1027° C.), the evaporation rate corresponds to a loss of less than 0.0002 inches per year from a solid tin dioxide surface.

Although tin dioxide is more easily reduced than alumina or zirconia, it is in fact more resistant to reduction than nickel oxide and ferric oxide, both of which are found as stable oxides in engines and other high temperature environments. Tin dioxide, therefore, has physical properties which make it suitable for use as a corrosion-resistant material in engines and other applications having oxidizing environments and high temperatures.

Tin dioxide does not react with the oxides of sodium, sulfur, and vanadium at temperatures below about 1500° C. in an oxygencontaining atmosphere. More specifically, tin dioxide does not react with vanadate-sulfate deposits at 700° C. or at 800° C. under sulfur trioxide partial pressure of from about $1 \times 10^{-7}$ bar to about $1 \times 10^{-2}$ bar. Indeed, it is believed that tin dioxide will give improved corrosion resistance even beyond these ranges.

The structural member that comes in contact with the reaction products can be made from tin dioxide itself or tin dioxide in admixture with other materials. Since tin dioxide is a white powder at room temperature, the structural member of tin dioxide or the mixtures may be made by pressing and sintering of tin dioxide or the mixtures in the form of the structural member.

The structural member which contacts the reaction products can also be made of a substrate and at least one coating thereon. The substrate and the at least one coating thereon are designed to withstand the high operating temperatures.

The substrate can be made of a metal, such as the metallic superalloy Rene 80, or a ceramic, such as silicon nitride or silicon carbide. Rene 80 is a nickel-based superalloy used for gas turbine blades. Specific examples of structural members composed of a substrate and at least one coating thereon include marine and industrial gas turbine blades, which are expected to withstand temperatures of about 700° to 900° C., and diesel engine exhaust valves and pistons, which are expected to withstand temperatures of about 500° C. to 800° C.

The thickness of the substrate can vary widely. For instance, pistons in some ship diesel engines can be about four feet in diameter and the exhaust valves can be over one foot in diameter. The thickness in these parts can vary widely from about 1/16 of an inch to several inches, such as about 5 inches, preferably ½ of an inch to 3 inches. In jet engines, the thickness of the substrate is generally in the range of 0.05–10 millimeters, but more commonly 1–5 millimeters. The thickness of the substrate is not considered to be critical in this invention.

Various coatings are commonly provided on the substrate to function as a thermal barrier, to protect from wear or as an inhibitor to reduce high temperature corrosion. An example of thermal barrier coatings is stabilized zirconia, an example of a wear coat is zirconia infiltrated with chromia and examples of high temperature corrosion-resistant coatings are alloys of cobalt or nickel containing chromium, aluminum, and yttrium. Presence of yttrium in the corrosion resistant coatings is optional. Further examples of high temperature corrosion-resistant coatings are the "aluminides" and "silicides", which are produced by diffusing aluminum and silicon, respectively, into the surface of superalloys or other substrates. Other metallic or ceramic coatings can also be used.

Tin dioxide itself can be applied as an outer coating directly on the substrate, on another coating as an outer coating, or it can be applied as a component of an outer coating in order to further inhibit high temperature corrosion caused by molten oxides of sodium and vanadium in the sodium-vanadate melt and gaseous oxide of sulfur in the vapor phase. When tin dioxide is applied as the principal ingredient onto a substrate as a coating, a portion of the coating may consist of other materials. The amount of tin dioxide in such coatings can vary from 50–100% by weight. When tin dioxide is applied as a component of another coating where it is not the principal ingredient, amount thereof in the coating can be 1–50%, preferably 5–30% by weight.

The thickness of the coating which contains tin dioxide or which is composed solely of tin dioxide are typically from about 0.5 to about 500 microns, preferably 2–250 microns. Thicker coatings provide greater protection but are likely to be more prone to spalling. However, thick thermal barrier coatings are also known which have thickness of up to about 0.5 of an inch, especially from about 0.05 up to about 0.25 of an inch. Pursuant to this invention, such coatings would also comprise tin dioxide.

An important application of the present invention is the use of tin dioxide as a stabilizer for zirconia thermal barrier coatings to produce zirconia stabilized with tin dioxide having superior resistance to molten vanadate-sulfate hot corrosion in presence of sulfur trioxide gas. Tin dioxide stabilizes zirconia in its high temperature tetragonal or cubic structures. Such stabilization avoids the catastrophic monoclinic-to-tetragonal or cubic transformation of zirconia that normally occurs with thermal cycling and so allows the use of stabilized zirconia in engines. When stabilized with tin dioxide, zirconia can form solid solutions with tin dioxide. The amount of tin dioxide in stabilized zirconia compositions or other anti-corrosion coating compositions is typically 1–50%, preferably 5–30% by weight.

Numerous methods exist which can be used to deposit tin oxide coatings on substrates, on other coatings or as a component part of a coating. These include spray pyrolysis, slurry coating, electron beam physical vapor deposition, chemical vapor deposition, sputter coating, and others. In reference specifically to the stabilized zirconia coatings, the tin dioxide stabilized zirconia coatings can be applied by electron beam physical vapor deposition or by plasma spraying of tin dioxide and zirconia powders.

Since tin has a melting temperature of 232° C., it would not be structurally useful at temperatures above its melting point. However, tin can be alloyed with other metals and may produce a tin oxide-containing coating which could be resistant to high temperature corrosion by sulfate-vanadate melts in presence of sulfur trioxide gas. The term "tin oxide" as used herein, includes general forms of oxides of tin such as tin monoxide and tin dioxide.

The invention having been generally described, the following examples are given as particular embodiments of the invention to demonstrate the practice and advantages thereof. It is understood that the examples are given by way of illustration and are not intended to limit the specification or the claims that follow, in any manner.

EXAMPLE 1

This example demonstrates that tin dioxide is highly resistant to high temperature reactions with sodium oxide ($Na_2O$) and vanadium pentoxide ($V_2O_5$) over a wide range of sodium oxide and vanadium pentoxide concentrations.

Equimolar mixtures of tin dioxide with each of the vanadium-containing compounds $V_2O_5$, $Na_2V_{12}O_{31}$ ($Na_2O.6V_2O_5$), $NaV_3O_8$ ($Na_2O.3V_2O_5$), $NaVO_3$ ($Na_2O.V_2O_5$), and $Na_3VO_4$ ($3Na_2O.V_2O_5$) were thoroughly ground and mixed together, and then heated in platinum boats over a period of 20–24 hours at 680° C. in one test and at 800° C. in a second test.

At the end of the heating periods, the mixtures were removed from the furnace and platinum boats, and subjected to x-ray diffraction analyses for evidence of reaction. In each case, there was no evidence of products being formed or any other indication of reaction. The tin dioxide x-ray diffraction pattern remained unchanged in terms of both absolute and relative peak intensities as well as interplanar distances. This confirms that tin dioxide was not consumed to form an amorphous product or any other product. Also, the fact that the relative peak intensities were not changed is evidence that tin dioxide was not dissolving in the melts and then precipitating upon cooling, since precipitated crystallites develop preferred growth habits that would have caused large and readily detectable changes in the relative intensities of the x-ray peaks.

This example is important for another reason: whereas a technical article alleges that tin dioxide reacts with vanadium pentoxide, this example shows that tin dioxide does not react with vanadium pentoxide at the temperature involved.

EXAMPLE 2

In this example, thermogravimetric analysis procedure was used to determine if tin dioxide ($SnO_2$) reacted with sodium oxide ($Na_2O$) or vanadium pentoxide ($V_2O_5$) components of vanadate-sulfate molten deposits in the presence of sulfur trioxide ($SO_3$) gas. The vanadate-sulfate deposits were produced by reacting sodium vanadate ($NaVO_3$) with sulfur trioxide at different partial pressures of sulfur trioxide yielding deposits which were mixtures of sodium vanadate ($NaVO_3$), sodium sulfate ($Na_2SO_4$) and vanadium pentoxide ($V_2O_5$), where sodium sulfate and vanadium pentoxide concentrations increased with increasing partial pressure of sodium trioxide. The tests were conducted at 700° C. and at 800° C., at which temperatures the deposits were molten.

Pursuant to the procedure herein, the thermobalance, furnace, and gas handling systems used are described and illustrated in the article by R. L. Jones, the inventor herein, entitled "Thermogravimetric Study of the 800° C. Reaction Zirconia Stabilizing Oxides with $SO_3$-$NaVO_3$", in Journal of Electrochemical Society, 139[10], pp. 2794–2799 (1992), except that the exit passageway of the balance counterflow air has been slightly modified to prevent $SO_3$ condensation on the balance hangwire at high $SO_3$ concentrations. The test temperatures of 700° and 800° C. were chosen both as being suitable for the experimental procedure and as being temperatures at which $SnO_2$ might ultimately be used. The test specimens consisted of 0.41 mmol (50 mg) of dry $NaVO_3$ and 0.41 mmol (50 mg) of dry $NaVO_3$ mixed with 0.10 mmol (15 mg) $SnO_2$. The specimens were held in the atmosphere for in excess of 24 hours where partial pressure of $SO_3$ was varied from about $1 \times 10^{-7}$ bar to about $1 \times 10^{-3}$ bar.

By weight gain analysis and x-ray diffraction analysis, it was shown that tin dioxide reacted with neither pure sodium metavanadate ($NaVO_3$) nor with the vanadate-sulfate deposit systems in the presence of sulfur trioxide at 700° C. nor at 800° C. At 700° C., the calculated approximate deposit compositions, in mole percent, at the indicated sulfur trioxide partial pressures were as follows:

|  | $1 \times 10^{-7}$ bar | $1 \times 10^{-3}$ bar |
| --- | --- | --- |
| $NaVO_3$ | 76% | 14% |
| $Na_2SO_4$ | 12% | 43% |
| $V_2O_5$ | 12% | 43% |

At 800° C., the calculated approximate deposit compositions, in mol percent, at the indicated sulfur trioxide partial pressures were as follows:

|  | $1 \times 10^{-7}$ bar | $1 \times 10^{-3}$ bar |
|---|---|---|
| NaVO$_3$ | 85% | 26% |
| Na$_2$SO$_4$ | 7.5% | 37% |
| V$_2$O$_5$ | 7.5% | 37% |

In this example, NaVO$_3$ was considered to simulate an engine deposit having Na/V ratio of 1 that exists in equilibrium with the SO$_3$ in the combustion gas. The equilibrium is described by the reaction:

$$2\ NaVO_3(l) + SO_3(g) \rightleftharpoons Na_2SO_4(l) + V_2O_5(l)$$

Published thermodynamic calculations indicate that this equilibrium reaction should be predominant under gas turbine conditions.

EXAMPLE 3

This example demonstrates preparation of zirconia stabilized with tin dioxide.

After tin chloride (SnCl$_4$) of commercial grade purity is dissolved in cold water, this solution is added to an appropriate quantity of zirconium oxychloride (ZrOCl$_2$) dissolved in 3 molar hydrochloric acid.

The acid solution is neutralized with a stoichiometric excess amount of 3 molar ammonium hydroxide. The precipitate, which forms on neutralization, is collected by filtration, washed several times with deionized water and dried. The precipitate is calcined for ½ hour at 600° C. to drive off all traces of ammonium chloride.

Pellets are formed of the precipitate by pressing the material in a uniaxial die system at 4000 psi. The pellets thus formed are then isostatically pressed at 25,000 psi to obtain a dense ceramic structure. This dense pellet is fired at 1300° C. for 3 hours whereby a solid solution is believed to be formed of zirconia and tin dioxide and the tetragonal or cubic crystal structure is produced.

The zirconia stabilized with tin dioxide formed as described in this example can be ground and applied in known manner, as by means of plasma spray, to a substrate in need of protection from high temperature corrosion.

In some circumstances, a binder or a bond coat may be necessary between the substrate and the stabilized zirconia coating. Any of the known binders or bond coats for zirconia coatings may be used for this purpose.

Many modifications and variations of the present invention are possible in light of the above teachings. It is, therefore, to be understoood that within the scope of the appended claims, the invention may be practiced otherwise than as specifically described.

What is claimed is:

1. A method of inhibiting corrosion at high temperature comprising the step of contacting a structural member with oxides of sodium and sulfur at a temperature of about 300°-1500° C., the structural member comprising a tin oxide.

2. The method of claim 1 including the step of combusting a hydrocarbon fuel comprising sodium and sulfur which, on combustion, become oxides of sodium and sulfur; wherein said contacting step is carried out at a temperature of 500°-1000° C.; and wherein amount of tin oxide in the structural member is at least 5% by weight.

3. The method of claim 2 wherein the structural member comprises a substrate and at least one outer coating on an exposed surface of said substrate comprising at least 5% by weight tin oxide, said outer coating being exposed to by-products of said hydrocarbon fuel.

4. The method of claim 3 wherein the substrate is selected from the group consisting of metals, ceramics, and mixtures thereof; and wherein said tin oxide is tin dioxide.

5. The method of claim 3 wherein the substrate is a superalloy; and wherein said outer coating is about 0.5-500 microns thick.

6. The method of claim 3 wherein said outer coating is zirconia containing 5-30% by weight tin dioxide.

7. The method of claim 6 wherein said outer coating is 2-250 microns thick; and wherein the partial pressure of said oxides of sulfur is from about $1 \times 10^{-7}$ bar to about $1 \times 10^{-2}$ bar.

8. The method by claim 6 wherein said outer coating is 0.05-0.25 of an inch thick; and wherein said partial pressure of said oxides of sulfur is from about $1 \times 10^{-7}$ bar to about $1 \times 10^{-2}$ bar.

9. The method of claim 3 wherein said outer coating is 2-250 microns thick; wherein the substrate is selected from the group consisting of silicon carbide, silicon nitride, and mixtures thereof.

10. A method of inhibiting corrosion at high temperature comprising the steps of:
   a) combusting a material which contains sodium, vanadium and sulfur to form reaction products which contain oxides of sodium, vanadium and sulfur, and
   b) contacting a structural member with the reaction products at a temperature of 300°-1500° C., the structural member comprising tin oxide.

11. The method of claim 10 wherein the material is a hydrocarbon fuel; wherein said contacting step is carried out at a temperature of 500°-1000° C.; wherein tin oxide is tin dioxide; and wherein the structural member comprises a substrate and at least one 0.5-500 microns thick coating adhering thereto, with said outer coating comprising tin dioxide at least a portion of which is exposed to reaction products of said hydrocarbon fuel.

12. The method of claim 11 wherein the substrate is selected from the group consisting of metals, ceramics, and mixtures thereof; and wherein the outer coating is 2-250 microns thick.

13. The method of claim 11 wherein the substrate of the structural member is a superalloy; and wherein the coating comprises 1-50% by weight tin dioxide.

14. The method of claim 11 wherein the substrate is a superalloy; and wherein the coating is zirconia containing 1-50% by weight tin dioxide.

15. The method of claim 11 wherein the coating is zirconia containing 5-30% by weight tin dioxide.

16. The method of claim 14 wherein at least one coating is 0.05-0.25 of an inch thick; and wherein the partial pressure of said oxides of sulfur is from about $1 \times 10^{-7}$ bar to about $1 \times 10^{-2}$ bar.

* * * * *